(12) United States Patent
Liu et al.

(10) Patent No.: US 10,620,499 B2
(45) Date of Patent: Apr. 14, 2020

(54) PIXEL CIRCUIT, PIXEL UNIT AND DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventors: Deqiang Liu, Beijing (CN); Feifei Wang, Beijing (CN); Ning Zhu, Beijing (CN); Ting Dong, Beijing (CN); Zhihua Sun, Beijing (CN); Yujie Gao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 57 days.

(21) Appl. No.: 15/933,271

(22) Filed: Mar. 22, 2018

(65) Prior Publication Data
US 2019/0064621 A1   Feb. 28, 2019

(30) Foreign Application Priority Data
Aug. 29, 2017  (CN) .......................... 2017 1 0759621

(51) Int. Cl.
*G02F 1/133*   (2006.01)
*G02F 1/1362*  (2006.01)
(Continued)

(52) U.S. Cl.
CPC ...... *G02F 1/136286* (2013.01); *G02F 1/1368* (2013.01); *G02F 1/13318* (2013.01);
(Continued)

(58) Field of Classification Search
CPC ....... G02F 1/13318; G02F 2001/13312; G02F 1/136286; G06F 3/0412; G09G 2360/142;
(Continued)

(56) References Cited

U.S. PATENT DOCUMENTS

2006/0267948 A1* 11/2006 Takahashi ........... G02F 1/13338
                                                        345/168
2008/0198143 A1*  8/2008 Kinoshita ............. G06F 3/0412
                                                        345/175
(Continued)

FOREIGN PATENT DOCUMENTS

CN    202049315 U    11/2011
CN    103592791 A     2/2014

OTHER PUBLICATIONS

Office Action received for Chinese Patent Application No. 201710759621.1, dated Sep. 30, 2019, 13 pages (6 pages of English Translation and 7 pages of Office Action).

*Primary Examiner* — Dennis P Joseph
(74) *Attorney, Agent, or Firm* — Womble Bond Dickinson (US) LLP (57) ABSTRACT

Embodiments of the present disclosure provide a pixel circuit. The pixel circuit includes a first transistor and a photosensitive component. A first end and a second end of the photosensitive component are connected to a gate line and a pixel electrode, respectively, and the photosensitive component is configured to transmit a signal of the gate line to the pixel electrode in response to receiving an external light signal. Embodiments of the present disclosure further provide a pixel unit including the pixel circuit as well as a display panel.

18 Claims, 4 Drawing Sheets

(51) Int. Cl.
*G02F 1/1368* (2006.01)
*G02F 1/1335* (2006.01)
*H01L 27/12* (2006.01)
*H01L 27/146* (2006.01)

(52) U.S. Cl.
CPC ...... *G02F 1/133512* (2013.01); *H01L 27/124* (2013.01); *H01L 27/14643* (2013.01); *G02F 2201/121* (2013.01); *G02F 2201/123* (2013.01)

(58) Field of Classification Search
CPC ......... G09G 2360/148; G09G 2360/14; G09G 2360/141; G09G 2360/144; G09G 2360/147
See application file for complete search history.

(56) References Cited

U.S. PATENT DOCUMENTS

| | | | |
|---|---|---|---|
| 2011/0069020 A1* | 3/2011 | Kim | G06F 3/0412 345/173 |
| 2012/0200546 A1* | 8/2012 | Miyamoto | H01L 27/14623 345/205 |
| 2012/0242920 A1* | 9/2012 | Xu | G02F 1/136213 349/42 |
| 2015/0062076 A1 | 3/2015 | Pan et al. | |
| 2015/0145833 A1* | 5/2015 | Yamazaki | G06F 3/042 345/175 |
| 2015/0221283 A1* | 8/2015 | Jia | G09G 3/3266 345/207 |

\* cited by examiner

PIXEL CIRCUIT, PIXEL UNIT AND DISPLAY PANEL

RELATED APPLICATION

The present application claims the benefit of Chinese Patent Application No. 201710759621.1, filed on Aug. 29, 2017, the entire disclosure of which is incorporated herein by reference.

FIELD

The present application relates, but is not limited to the field of display technologies, and particularly to a pixel circuit, a pixel unit and a display panel.

BACKGROUND

At present, displays are operated in various modes, such as mouse operation, remote control operation and touch operation, and so on. With the development and upgrading of display technologies, users have put more requirements on the functions and operation modes of displays, wherein the human-machine interaction operation becomes a development trend of far-end remote control operations.

Related art displays, for example, thin film transistor-liquid crystal displays (TFT-LCD) and organic light-emitting diode (OLED) displays are all passive display structures. A TFT-LCD is taken as an example below for illustration. Light emitted from a backlight passes through a lower polarizer, which is modulated by liquid crystals (abbreviated as LC) and then detected by an upper polarizer, thereby exhibiting different intensities.

SUMMARY

In view of above, an aspect of the present disclosure provides a pixel circuit, comprising a first transistor and a photosensitive component. A first end and a second end of the photosensitive component are connected to a gate line and a pixel electrode, respectively, wherein the photosensitive component is configured to transmit a signal of the gate line to the pixel electrode in response to receiving an external light signal.

According to some embodiments, the photosensitive component comprises a photosensitive device and a second transistor. A first terminal of the photosensitive device is connected to the gate line, a second terminal of the photosensitive device is connected to a control terminal of the second transistor, a first terminal of the second transistor is connected to the control terminal of the second transistor, and a second terminal of the second transistor is connected to the pixel electrode.

According to some embodiments, a photosensitive structure of the photosensitive device, an active layer of the second transistor, and an active layer of the first transistor are disposed in a same layer and formed by one patterning process.

According to some embodiments, the first terminal of the photosensitive device, the second terminal of the photosensitive device, the first terminal of the second transistor, the first terminal of the first transistor, and the second terminal of the first transistor are disposed in a same layer and formed by one patterning process.

According to some embodiments, the second terminal of the second transistor, the first terminal of the first transistor, and the second terminal of the first transistor are disposed in a same layer and formed by one patterning process.

According to some embodiments, the second terminal of the second transistor and the pixel electrode are disposed in a same layer and formed by one patterning process.

According to some embodiments, the photosensitive component comprises a photodiode. An anode of the photodiode is connected to the gate line, and a cathode of the photodiode is connected to the pixel electrode.

According to some embodiments, a photosensitive structure of the photodiode and an active layer of the first transistor are disposed in a same layer and formed by one patterning process.

According to some embodiments, the anode of the photodiode, the cathode of the photodiode, a first terminal of the first transistor, and a second terminal of the first transistor are disposed in a same layer and formed by one patterning process.

According to some embodiments, the anode of the photodiode, a first terminal of the first transistor, and a second terminal of the first transistor are disposed in a same layer and formed by one patterning process, and the cathode of the photodiode and the pixel electrode are disposed in a same layer and formed by one patterning process.

According to some embodiments, the photosensitive device comprises a photodiode. An anode of the photodiode is connected to the gate line, and a cathode of the photodiode is connected to the control terminal of the second transistor.

According to some embodiments, the photosensitive component comprises a photosensitive resistor. A first end of the photosensitive resistor is connected to the gate line, and a second end of the photosensitive resistor is connected to the pixel electrode.

Another aspect of the present disclosure provides a pixel unit, comprising a plurality of sub-pixel units of different colors, wherein at least one sub-pixel unit comprises any of the pixel circuits described above.

According to some embodiments, at least one of the other sub-pixel units comprises an auxiliary photosensitive component. A first end of the auxiliary photosensitive component is connected to a pixel electrode of a sub-pixel unit where the auxiliary photosensitive component resides, a second end of the auxiliary photosensitive component is connected to a common electrode line, and the auxiliary photosensitive component is configured to transmit a signal of the pixel electrode to the common electrode line in response to receiving an external light signal.

According to some embodiments, the auxiliary photosensitive component comprises an auxiliary photosensitive device and a third transistor. A first terminal of the auxiliary photosensitive device is connected to the pixel electrode of the sub-pixel unit where the auxiliary photosensitive device resides, a second terminal of the auxiliary photosensitive device is connected to a control terminal of the third transistor, a first terminal of the third transistor is connected to the control terminal of the third transistor, and a second terminal of the third transistor is connected to the common electrode line.

A further aspect of the present disclosure provides a display panel, comprising any of the pixel units described above.

According to some embodiments, the above display panel further comprises a light-transmitting area configured to enable the photosensitive component to receive the external light signal.

According to some embodiments, the above display panel further comprises a substrate below the photosensitive component and a black matrix above the photosensitive component. The light-transmitting area is disposed in the black matrix, and an orthographic projection of the light-transmitting area on the substrate at least partially overlaps an orthographic projection of the photosensitive component on the substrate.

According to some embodiments, the above display panel further comprises a light-shielding member on a side of the photosensitive component opposite to the light-transmitting area, wherein an orthographic projection of the light-shielding member on the substrate at least partially overlaps the orthographic projection of the light-transmitting area on the substrate.

According to some embodiments, the light-shielding member and the gate line are disposed in a same layer and formed by one patterning process.

BRIEF DESCRIPTION OF DRAWINGS

Accompanying drawings are used to provide a further understanding of the technical solutions of the present disclosure and constitute a part of the specification. The accompanying drawings, along with embodiments of the present disclosure, are used to explain the technical solutions of the present disclosure, without limiting the technical solutions of the present disclosure.

DETAILED DESCRIPTION

In order to make the objectives, technical solutions, and advantages of the present disclosure more comprehensible, embodiments of the present disclosure will be described in detail below with reference to the accompanying drawings. It is to be noted that, in the case of causing no conflict, embodiments in the present disclosure and features in the embodiments may be arbitrarily combined with each other.

The following specific embodiments provided by the present disclosure may be combined with each other, and the same or similar concepts or processes may not be described in detail in some embodiments.

Figure 1:
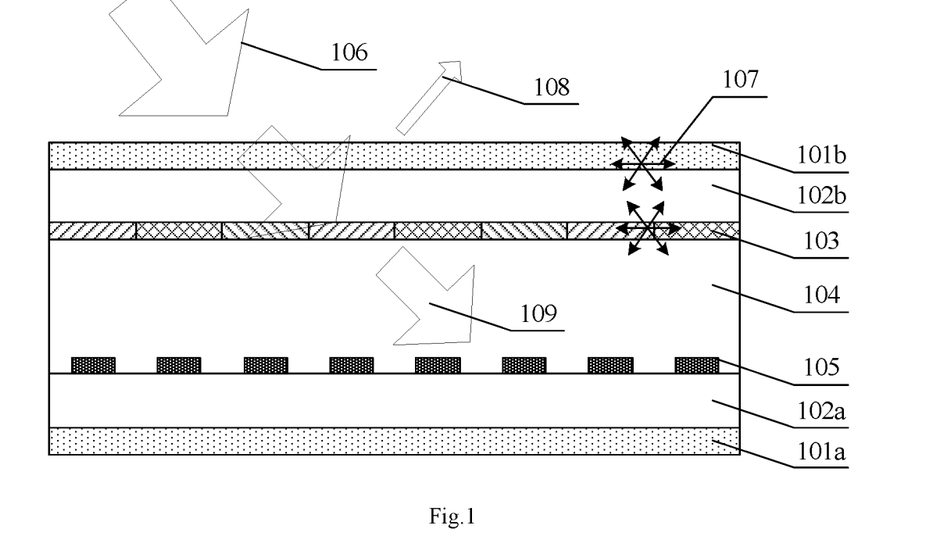
FIG. 1 is a schematic structural view of a typical display device.

FIG. 1 is a schematic structural view of a typical display device. As shown in FIG. 1, the display device comprises an array substrate and a color film substrate aligned with each other, a liquid crystal layer 104 disposed between the array substrate and the color film substrate, a lower polarizer 101a disposed on a light incident side of the array substrate, and an upper polarizer 101b disposed on a light exit side of the color film substrate. The array substrate comprises a substrate 102a and a TFT array layer 105. The color film substrate comprises a substrate 102b and a color filter layer 103. The substrates 102a and 102b may be made of glass.

In the typical TFT-LCD structure as shown in FIG. 1, when light 106 is incident on the display device, it may be scattered, reflected and absorbed, so the intensities of scattered light 107 and reflected light 108 formed are extremely weak. These light rays are difficult to perceive by the user, thus it is difficult to realize the human-machine interaction function.

Due to the structural feature of passive light emission and the transparency of the display device, the TFT-LCD often needs an external sensor to carry out the human-machine interaction operation, for example, using a mouse, a touch panel, and so on. As a result, more hardware facilities need to be provided for the display device, and a processor needs to be involved in the process of human-machine interaction, thereby increasing the difficulty of design and the overall cost. However, the manner of realizing the human-machine interaction function by covering the panel surface with a scattering film has seriously affected the light transmittance of the panel, thereby greatly reducing the picture quality of the display device. It can be seen that it is difficult for the existing solutions to give consideration to both the realization of the human-machine interaction function and the requirements on the picture quality.

The inventors of the present disclosure have found that, in fact, the intensity of transmitted light 109 transmitted into the display device is extremely high, and therefore, embodiments of the present disclosure realize the human-machine interaction function using the transmitted light 109 transmitted into the display device based on the transparency characteristic of the display device.

Technical solutions of the embodiments of the present disclosure will be described in detail below through specific embodiments. It should be noted that the "patterning process" mentioned in the embodiments includes processings such as coating a photoresist, exposing by a mask, developing, etching, stripping the photoresist, and so on, and the patterning process is a mature manufacturing process.

Figure 2:
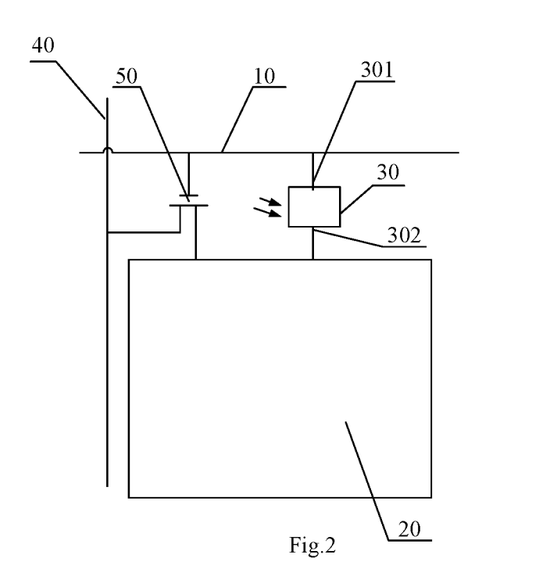
FIG. 2 is a schematic diagram showing the principle of a pixel circuit according to an embodiment of the present disclosure.

FIG. 2 is a schematic diagram showing the principle of a pixel circuit according to an embodiment of the present disclosure. As shown in FIG. 2, the pixel circuit according to an embodiment of the present disclosure comprises a first transistor 50 and a photosensitive component 30. A control terminal of the first transistor 50 is connected to a gate line 10, a first terminal of the first transistor 50 is connected to a data line 40, and a second terminal of the first transistor 50 is connected to a pixel electrode 20. A first end 301 and a second end 302 of the photosensitive component 30 are connected to the gate line 10 and the pixel electrode 20, respectively, and the photosensitive component 30 is configured to transmit a signal of the gate line 10 to the pixel electrode 20 in response to receiving an external light signal. Specifically, when receiving the external light signal, the photosensitive component 30 connects the first end 301 with the second end 302 to transmit the signal of the gate line 10 to the pixel electrode 20, that is, the signal of the gate line 10 is used to charge the pixel electrode 20.

In embodiments of the present disclosure, the manner of enabling the display panel to perform human-machine interaction is described by taking a pixel circuit of one sub-pixel unit in the display panel as a minimum structure. The pixel circuit described in embodiments of the present disclosure is a basic circuit of a sub-pixel unit in the display panel for emitting monochromatic light.

Working principle of the pixel circuit according to the embodiment of the present disclosure is as follows. When the photosensitive component 30 is not irradiated with light, that is, the photosensitive component 30 does not receive the external light signal, the first end 301 of the photosensitive component 30 is disconnected from the second end 302 of the photosensitive component 30, and the pixel electrode 20 is normally controlled by the first transistor 50. When the photosensitive component 30 is irradiated with light, that is, the photosensitive component 30 receives the external light signal, the first end 301 of the photosensitive component 30 is connected with the second end 302 of the photosensitive component 30, thereby transmitting the signal on the gate line 10 to the pixel electrode 20, so that a sub-pixel unit to which the pixel electrode 20 corresponds is lighted up. Macroscopically, the display panel displays an indicated position to the user by presenting a local bright spot, thereby realizing the human-machine interaction function.

The process of human-machine interaction between a user and a display panel including the pixel circuit is illustrated below based on an example in which the user uses a laser to perform human-machine interaction. The user uses the laser to emit laser light. The laser light irradiates on the photosensitive component 30 such that the first end 301 of the photosensitive component 30 is connected with the second end 302 of the photosensitive component 30, thereby transmitting the signal on the gate line 10 to the pixel electrode 20. Under the effect of a voltage difference between the pixel electrode 20 and a common electrode, liquid crystal in the sub-pixel unit where the pixel circuit resides is deflected to enable light emitted by the backlight to be transmitted, so that the corresponding sub-pixel unit is lighted up and presents a corresponding color. As a result, macroscopically, the display panel presents a local bright spot to show the user the position irradiated by the laser, thereby realizing the human-machine interaction function.

It is to be noted that embodiments of the present disclosure are not limited to using a laser to implement human-machine interaction. In various embodiments according to the present disclosure, a far-end remote control operation and the like may also be used, which can be considered as a manner in embodiments of the present disclosure for implementing human-machine interaction as long as the user provides a light signal to the pixel circuit of the display panel, and the external light signal can be recognized by the photosensitive component in the pixel circuit and fed back to the pixel electrode.

In the pixel circuit according to the embodiment of the present disclosure, when receiving the external light signal, the photosensitive component transmits the signal of the gate line to the pixel electrode so that a corresponding sub-pixel unit is lighted up. Therefore, macroscopically, the display panel displays the indicated position to the user by presenting a local bright spot, thereby realizing the human-machine interaction function. In addition, the above manner for implementing human-machine interaction does not affect the light transmittance and the display effect of the display panel, thus solving the problem that it is difficult for the prior art display panel to give consideration to both the realization of the human-machine interaction function and the display effect.

Further, in the pixel circuit according to an embodiment of the present disclosure, the external light signal is received by the photosensitive component fabricated in the pixel circuit and the received external light signal is directly fed back to the pixel electrode. The display panel that employs the pixel circuit can directly detect and feed back the external light signal, which neither needs to involve a processor in the processing, nor needs to set additional hardware facilities in the display panel to realize the human-machine interaction function. As a result, the design difficulty and the cost of the display panel are reduced, and this display panel having the human-machine interaction function is easier to implement.

Figure 3:
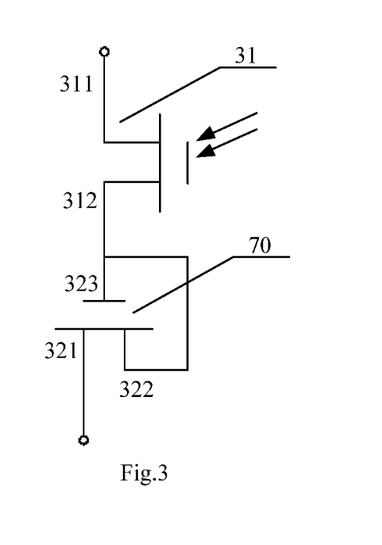
FIG. 3 is a schematic structural view of a photosensitive component according to an embodiment of the present disclosure.

FIG. 3 schematically illustrates a specific structure of a photosensitive component according to an embodiment of the present disclosure which may be used in the pixel circuit shown in FIG. 2. As shown in FIG. 3, the photosensitive component comprises a photosensitive device 31 and a second transistor 70. A first terminal 311 of the photosensitive device 31 is connected to the gate line, and a second terminal 312 of the photosensitive device 31 is connected to a control terminal 323 of the second transistor 70. A first terminal 322 of the second transistor 70 is connected to the control terminal 323 of the second transistor 70, and a second terminal 321 of the second transistor 70 is connected to the pixel electrode.

The photosensitive device 31 may be a photodiode. In this case, an anode of the photodiode is connected to the gate line, and a cathode of the photodiode is connected to the control terminal 323 of the second transistor.

The photosensitive component shown in FIG. 3 has a unidirectional conduction performance. Therefore, the photosensitive component can only transmit the signal of the gate line to the pixel electrode, but not transmit a signal of the pixel electrode to the gate line, thereby preventing the pixel electrode from affecting the signal of the gate line.

The working principle of the photosensitive component according to this embodiment is as follows. When the photosensitive device 31 does not receive an external light signal, the first terminal 311 of the photosensitive device 31 is disconnected from the second terminal 312 of the photosensitive device 31, so that the first terminal 311 of the photosensitive device 31 and the second terminal 321 of the second transistor 70 are also in an off state. At that time, the pixel electrode 20 is normally controlled by the first transistor 50, as shown in FIG. 2. When the photosensitive device 31 receives an external light signal, the first terminal 311 of the photosensitive device 31 is connected with the second terminal 312 of the photosensitive device 31, thereby transmitting the signal of the gate line to the control terminal 323 and the first terminal 322 of the second transistor 70. Under the control of the control terminal 323 of the second transistor 70, the first terminal 322 of the second transistor 70 is connected with the second terminal 321 of the second transistor 70, so that the signal of the gate line is transmitted from the first terminal 322 of the second transistor to the second terminal 321 of the second transistor, and further transmitted to the pixel electrode.

During a process of manufacturing the pixel circuit that uses the photosensitive component as shown in FIG. 3, optionally, a photosensitive structure of the photosensitive device 31 and an active layer of the second transistor 70 may both be disposed in the same layer as an active layer of the first transistor 50. Therefore, the photosensitive structure of the photosensitive device 31, the active layer of the second transistor 70, and the active layer of the first transistor 50 can be formed by one patterning process, thereby simplifying the preparation process and reducing the preparation cost.

It is to be noted that, the expression "A is disposed in the same layer as B" as used herein means that, A and B are made of the same material(s) and prepared by one and the same patterning process. Being disposed in the same layer does not necessarily mean such a layer is planar or smooth. For example, if a lower structure is non-planar, the layer in which A and B are disposed and covering the non-planar lower structure is also non-planar.

In an exemplary embodiment, the first terminal 311 of the photosensitive device 31, the second terminal 312 of the photosensitive device 31, and the first terminal 322 of the second transistor 70 may all be disposed in the same layer as the first terminal and the second terminal of the first transistor 50. Therefore, the first terminal 311 and the second terminal 312 of the photosensitive device 31, the first terminal 322 of the second transistor 70, and the first terminal and the second terminal of the first transistor 50 can be formed by one patterning process, thereby simplifying the preparation process and reducing the preparation cost.

In an alternative embodiment, the second terminal 321 of the second transistor 70 may be disposed in the same layer as the first terminal and the second terminal of the first transistor 50, thus the second terminal 321 of the second transistor 70, and the first terminal and the second terminal of the first transistor 50 can be formed by one patterning process, thereby simplifying the manufacturing process and reduce the manufacturing cost. Alternatively, the second terminal 321 of the second transistor 70 may be disposed in the same layer as the pixel electrode 20, thus the second terminal 321 of the second transistor 70 and the pixel electrode 20 can be formed by one patterning process, thereby simplifying the manufacturing process and reducing the preparation cost.

Figure 4:
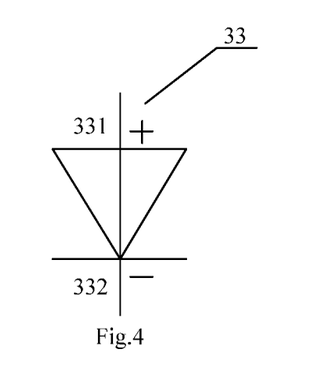
FIG. 4 is a schematic structural view of a photosensitive component according to another embodiment of the present disclosure.

FIG. 4 schematically illustrates a structure of a photosensitive component according to another embodiment of the present disclosure which may be used in the pixel circuit shown in FIG. 2. As shown in FIG. 4, the photosensitive component comprises a photodiode 33. An anode 331 of the photodiode 33 is connected to the gate line, and a cathode 332 of the photodiode 33 is connected to the pixel electrode.

When the photodiode 33 does not receive an external light signal, the anode 331 of the photodiode 33 is disconnected from the cathode 332 of the photodiode 33, and the pixel electrode is normally controlled by the first transistor. When the photodiode 33 receives an external light signal, the anode 331 of the photodiode 33 is connected with the cathode 332 of the photodiode 33, thereby transmitting the signal of the gate line to the pixel electrode. The photodiode 33 is unidirectionally conducting, so that it is possible to prevent the pixel electrode from interfering with the signal of the gate line.

During a process of manufacturing the pixel circuit that uses the photosensitive component as shown in FIG. 4, optionally, a photosensitive structure of the photodiode 33 may be disposed in the same layer as the active layer of the first transistor, thus the photosensitive structure of the photodiode 33 and the active layer of the first transistor can be formed by one patterning process, thereby simplifying the preparation process and reducing the preparation cost.

In an alternative embodiment, the anode and the cathode of the photodiode 33 may both be disposed in the same layer as the first terminal and the second terminal of the first transistor, thus the anode and the cathode of the photodiode 33, and the first terminal and the second terminal of the first transistor can be formed by one patterning process, thereby simplifying the preparation process and reducing the preparation cost. Alternatively, the anode of the photodiode 33 may be disposed in the same layer as the first terminal and the second terminal of the first transistor, and the cathode of the photodiode 33 may be disposed in the same layer as the pixel electrode.

The photosensitive component that may be used in the pixel circuit according to the present disclosure is schematically illustrated above. However, as will be recognized by those skilled in the art, embodiments of the present disclosure are not so limited, but photosensitive components having other structures may also be used. For example, in an exemplary embodiment, the photosensitive component may comprise a photosensitive resistor, wherein one end of the photosensitive resistor is connected to the gate line, and the other end of the photosensitive resistor is connected to the pixel electrode. When the photosensitive resistor does not receive an external light signal, the resistance of the photosensitive resistor is relatively large, so that the two ends of the photosensitive resistor are disconnected, and the pixel electrode is normally controlled by the first transistor. When the photosensitive resistor receives an external light signal, the resistance of the photosensitive resistor is relatively small, so that the two ends of the photosensitive resistor are connected, thereby transmitting the signal of the gate line to the pixel electrode.

In practical applications, users often have different demands on the feedback of the display panel when performing human-machine interaction with the display panel. For example, in a display panel for color display, when a user makes light irradiate on the display panel, the user often wants the display panel to feed back colored light. Therefore, embodiments of the present disclosure propose, based on the inventive concept of the foregoing embodiments, a pixel unit including a plurality of sub-pixel units of different colors, wherein at least one sub-pixel unit includes the pixel circuit according to any one of the foregoing embodiments, and at least one of the other sub-pixel units includes an auxiliary photosensitive component. A first end of the auxiliary photosensitive component is connected to a pixel electrode of the sub-pixel unit where the auxiliary photosensitive component resides, the second end of the auxiliary photosensitive component is connected to a common electrode line, and the auxiliary photosensitive component is configured to, when receiving an external light signal, transmit a signal of the pixel electrode of the sub-pixel unit where the auxiliary photosensitive component resides to the common electrode line.

Figure 5:
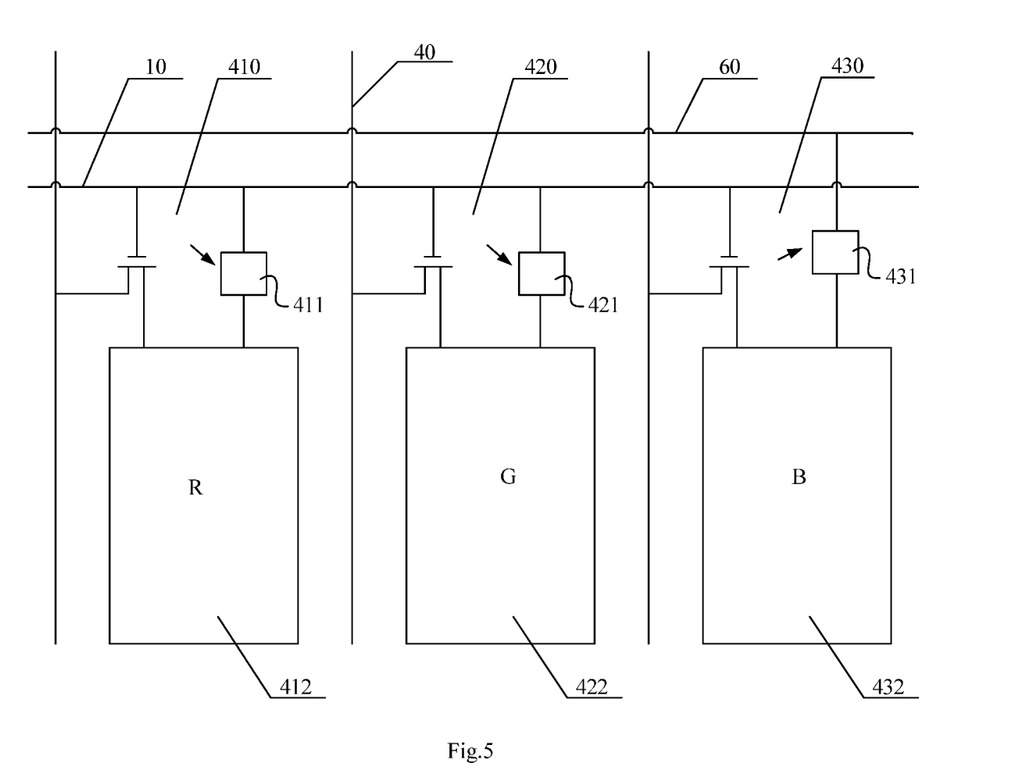
FIG. 5 is a schematic view of a pixel unit according to an embodiment of the present disclosure.

FIG. 5 is a schematic view of a pixel unit according to an embodiment of the present disclosure. In FIG. 5, the pixel unit includes a red (R) sub-pixel unit 410, a green (G) sub-pixel unit 420 and a blue (B) sub-pixel unit 430.

In this pixel unit, the red sub-pixel unit 410 and the green sub-pixel unit 420 each comprises the pixel circuit according to the foregoing embodiments, and the blue sub-pixel unit 430 comprises an auxiliary photosensitive component. In the red sub-pixel unit 410, a first end of a first photosensitive component 411 is connected to a gate line 10, and a second end of the first photosensitive component 411 is connected to a first pixel electrode 412. In the green sub-pixel unit 420, a first end of a second photosensitive component 421 is connected to the gate line 10, and a second end of the second photosensitive component 421 is connected to a second pixel electrode 422. In the blue sub-pixel unit 430, a first end of an auxiliary photosensitive component 431 is connected to a third pixel electrode 432, and a second end of the auxiliary photosensitive component 431 is connected to a common electrode line 60. When there is no external light signal, each sub-pixel unit is controlled by respective first transistors. When receiving an external light signal, the first photosensitive component 411 and the second photosensitive component 421 transmit a signal of the gate line 10 to the first pixel electrode 412 and the second pixel electrode 422, respectively, thereby lighting up the corresponding red sub-pixel unit 410 (emitting red light) and the green sub-pixel unit 420 (emitting green light), while the auxiliary photosensitive component 431 connects the third pixel electrode 432 of the blue sub-pixel unit 430 to the common electrode line 60 when receiving the external light signal, thereby transmitting a signal of the third pixel electrode 432 of the blue sub-pixel unit 430 to the common electrode line for complete discharge of the third pixel electrode 432. As a result, the blue sub-pixel unit is completely turned off. Therefore, in this embodiment, the pixel unit can feed back synthesized light of red and green light, i.e. yellow light, to the user.

It is to be noted that, FIG. 5 only shows one pixel unit in the display panel, as well as an example implementation in which the pixel unit feeds back yellow light. However, as will be understood by those skilled in the art, it is possible to enable the pixel unit to achieve the display effects of feeding back green light, red light, blue light and other synthesized light by setting the category and the number of sub-pixel units including the auxiliary photosensitive component.

In an alternative embodiment, the blue sub-pixel unit may not include the auxiliary photosensitive component. In such an embodiment, the blue sub-pixel unit is only normally controlled by the first transistor. When the pixel unit receives an external light signal, the red sub-pixel unit and the green sub-pixel unit are completely lighted up, and the blue sub-pixel unit performs normal display according to a display signal. It is also possible to enable the display panel to display the indicated position to the user by showing a local colored bright spot, thereby achieving the human-machine interaction function.

It is to be noted that, although an example implementation of the present disclosure is illustrated by taking an RGB color scheme as an example in the pixel unit shown in FIG. 5, the principle of the present disclosure may be applied to pixel units which adopt other color schemes, such as RGBW, RGBG pixel units and the like.

In an embodiment according to the present disclosure, the auxiliary photosensitive component may specifically comprise an auxiliary photosensitive device and a third transistor. A first terminal of the auxiliary photosensitive device is connected to a pixel electrode of the sub-pixel unit where the auxiliary photosensitive device resides, a second terminal of the auxiliary photosensitive device is connected to a control terminal of the third transistor, a first terminal of the third transistor is connected to the control terminal of the third transistor, and a second terminal of the third transistor is connected to the common electrode line.

In another embodiment, the auxiliary photosensitive component may comprise an auxiliary photodiode, wherein an anode of the auxiliary photodiode is connected to the pixel electrode of the sub-pixel unit where the auxiliary photodiode resides, and a cathode of the auxiliary photodiode is connected to the common electrode line.

In another embodiment, the auxiliary photosensitive component may include an auxiliary photosensitive resistor, wherein a first end of the auxiliary photosensitive resistor is connected to the pixel electrode of the sub-pixel unit where the auxiliary photosensitive resistor resides, and a second end of the auxiliary photosensitive resistor is connected to the common electrode line.

Figure 6:
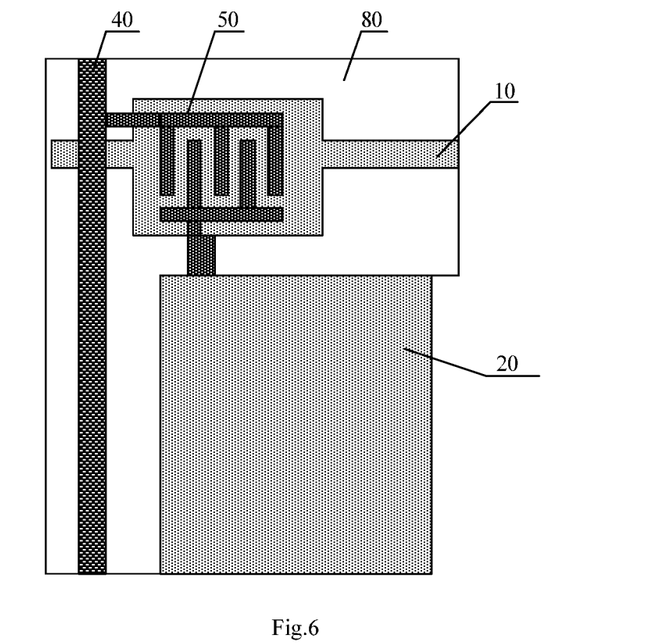
FIG. 6 is a bottom structural view of a typical display panel.

FIG. 6 is a bottom structural view of a typical display panel. The display panel comprises a gate line 10, a data line 40, a first transistor 50, and a pixel electrode 20. In order to prevent light from affecting the characteristics of the first transistor 50 and prevent light leakage, a black matrix 80 is disposed in a region outside the pixel electrode 20 to shield external light.

In contrast, based on the inventive concept of the foregoing embodiments, embodiments of the present disclosure further provide a display panel comprising the pixel circuit according to any one of the foregoing embodiments or comprising the pixel unit according to any one of the foregoing embodiments, and the display panel is provided with a light-transmitting area for enabling the photosensitive component to receive an external light signal.

Figure 7:
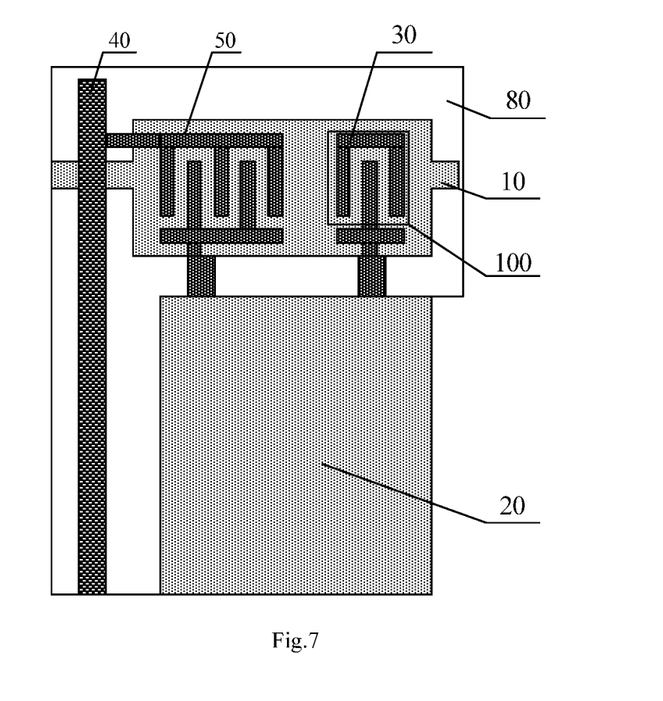
FIG. 7 is a bottom structural view of a display panel according to an embodiment of the present disclosure.

FIG. 7 is a schematic bottom structural view of a display panel according to an embodiment of the present disclosure. The display panel shown in FIG. 7 is different from the typical display panel shown in FIG. 6 in that the display panel according to an embodiment of the present disclosure further comprises a photosensitive component 30. The photosensitive component 30 is disposed in a region outside the pixel electrode 20 and is covered with a black matrix 80. In order to enable the photosensitive component 30 to receive an external light signal, a light-transmitting area 100 is disposed on the display panel to enable the photosensitive component 30 to receive an external light signal. Light from a user may irradiate on a photosensitive structure of the photosensitive component 30 through the light-transmitting area 100. Specifically, the light-transmitting area 100 is disposed in the black matrix 80, that is, a hollow structure is disposed in the black matrix 80, and the photosensitive component 30 receives light from the user through the hollow structure in the black matrix.

Although the light-transmitting area 100 shown in FIG. 7 completely exposes the photosensitive component 30 to fully receive an external light signal, in consideration of the actual charging condition of the pixel electrode, in order to prevent overcharging, the actual photosensitive degree of the photosensitive component 30 can be adjusted by adjusting the size of the light-transmitting area 100. Specifically, in an actual implementation, an orthographic projection of the light-transmitting area 100 on the substrate of the display panel contains an orthographic projection of the photosensitive component 30 on the substrate. In this way, the photosensitive component 30 is completely exposed through the light-transmitting area 100 to fully receive an external light signal provided by the user. Alternatively, the orthographic projection of the light-transmitting area 100 on the substrate may also be located within the orthographic projection of the photosensitive component 30 on the substrate. In this way, the photosensitive component 30 is partially exposed through the light-transmitting area 100, thereby preventing the pixel electrode from being overcharged to meet different demands of the user. The orthographic projections of the light-transmitting area 100 and the photosensitive component 30 on the substrate may also have other positional relationships, but it should be ensured that the orthographic projections of the light-transmitting area 100 and the photosensitive component 30 on the substrate at least partially overlap.

In an actual implementation, when the light-transmitting area 100 is disposed in the black matrix 80, light leakage may occur in the light-transmitting area 100 during display of the display panel, in turn affecting the image quality. Therefore, in an exemplary embodiment of the present disclosure, the display panel is further provided with a light-shielding member configured to prevent light leakage in the light-transmitting area. It will be understood that the light-shielding member should be disposed on a side of the photosensitive component opposite to the light-transmitting area, and orthographic projections of the light-shielding member and the light-transmitting area on the substrate should at least partially overlap to prevent light leakage in the light-transmitting area, thereby ensuring the image quality of the display panel.

Optionally, the light-shielding member may be disposed in the same layer as the gate line, thus the light-shielding member and the gate line can be formed by one patterning process, thereby simplifying the preparation process and reducing the preparation cost.

Although various example implementations of the present disclosure are described herein by way of example, those contents are just embodiments adopted for facilitating understanding of the present disclosure rather than limiting the present disclosure. Any person skilled in the art to which the present disclosure pertains may make any change and modification in the form and details of implementation without departing from the spirit and scope revealed by the present disclosure. However, the protection scope of the present disclosure must be defined based on the scope of the appended claims.

The invention claimed is:

1. A pixel unit, comprising a plurality of sub-pixel units of different colors,
   wherein at least one sub-pixel unit comprises a pixel circuit comprising a first transistor and a photosensitive component, a first end and a second end of the photosensitive component being connected to a gate line and a pixel electrode, respectively, wherein the photosensitive component is configured to transmit a signal of the gate line to the pixel electrode in response to receiving an external light signal, and
   wherein at least one of the other sub-pixel units comprises an auxiliary photosensitive component, a first end of the auxiliary photosensitive component is connected to a pixel electrode of a sub-pixel unit where the auxiliary photosensitive component resides, a second end of the auxiliary photosensitive component is connected to a common electrode line, and the auxiliary photosensitive component is configured to transmit a signal of the pixel electrode to the common electrode line in response to receiving an external light signal.

2. The pixel unit according to claim 1, wherein the auxiliary photosensitive component comprises an auxiliary photosensitive device and a third transistor, a first terminal of the auxiliary photosensitive device is connected to the pixel electrode of the sub-pixel unit where the auxiliary photosensitive device resides, a second terminal of the auxiliary photosensitive device is connected to a control terminal of the third transistor, a first terminal of the third transistor is connected to the control terminal of the third transistor, and a second terminal of the third transistor is connected to the common electrode line.

3. A display panel, comprising the pixel unit according to claim 1.

4. The display panel according to claim 3, further comprising a light-transmitting area configured to enable the photosensitive component to receive the external light signal.

5. The display panel according to claim 4, further comprising a substrate below the photosensitive component and a black matrix above the photosensitive component, the light-transmitting area being disposed in the black matrix, an orthographic projection of the light-transmitting area on the substrate at least partially overlapping an orthographic projection of the photosensitive component on the substrate.

6. The display panel according to claim 5, further comprising a light-shielding member on a side of the photosensitive component opposite to the light-transmitting area, wherein an orthographic projection of the light-shielding member on the substrate at least partially overlaps the orthographic projection of the light-transmitting area on the substrate.

7. The display panel according to claim 6, wherein the light-shielding member and the gate line are disposed in a same layer and formed by one patterning process.

8. The pixel unit according to claim 1, wherein the photosensitive component comprises a photosensitive device and a second transistor, a first terminal of the photosensitive device being connected to the gate line, a second terminal of the photosensitive device being connected to a control terminal of the second transistor, a first terminal of the second transistor being connected to the control terminal of the second transistor, a second terminal of the second transistor being connected to the pixel electrode.

9. The pixel unit according to claim 8, wherein a photosensitive structure of the photosensitive device, an active layer of the second transistor, and an active layer of the first transistor are disposed in a same layer and formed by one patterning process.

10. The pixel unit according to claim 8, wherein the first terminal of the photosensitive device, the second terminal of the photosensitive device, the first terminal of the second transistor, the first terminal of the first transistor, and the second terminal of the first transistor are disposed in a same layer and formed by one patterning process.

11. The pixel unit according to claim 8, wherein the second terminal of the second transistor, the first terminal of the first transistor, and the second terminal of the first transistor are disposed in a same layer and formed by one patterning process.

12. The pixel unit according to claim 8, wherein the second terminal of the second transistor and the pixel electrode are disposed in a same layer and formed by one patterning process.

13. The pixel unit according to claim 8, wherein the photosensitive device comprises a photodiode, an anode of the photodiode being connected to the gate line, a cathode of the photodiode being connected to the control terminal of the second transistor.

14. The pixel unit according to claim 1, wherein the photosensitive component comprises a photodiode, an anode of the photodiode being connected to the gate line, a cathode of the photodiode being connected to the pixel electrode.

15. The pixel unit according to claim 14, wherein a photosensitive structure of the photodiode and an active layer of the first transistor are disposed in a same layer and formed by one patterning process.

16. The pixel unit according to claim 14, wherein the anode of the photodiode, the cathode of the photodiode, a first terminal of the first transistor, and a second terminal of the first transistor are disposed in a same layer and formed by one patterning process.

17. The pixel unit according to claim 14, wherein the anode of the photodiode, a first terminal of the first transistor, and a second terminal of the first transistor are disposed in a same layer and formed by one patterning process, and the cathode of the photodiode and the pixel electrode are disposed in a same layer and formed by one patterning process.

18. The pixel unit according to claim 1, wherein the photosensitive component comprises a photosensitive resistor, a first end of the photosensitive resistor being connected to the gate line, a second end of the photosensitive resistor being connected to the pixel electrode.

\* \* \* \* \*